(12) United States Patent
Shi et al.

(10) Patent No.: US 11,643,733 B2
(45) Date of Patent: May 9, 2023

(54) TA-C BASED COATINGS WITH IMPROVED HARDNESS

(71) Applicant: Nanofilm Technologies International Limited, Singapore (SG)

(72) Inventors: Xu Shi, Singapore (SG); Zhi Tang, Singapore (SG)

(73) Assignee: NANOFILM TECHNOLOGIES INTERNATIONAL LIMITED, Singapore (SG)

( * ) Notice: Subject to any disclaimer, the term of this patent is extended or adjusted under 35 U.S.C. 154(b) by 0 days.

(21) Appl. No.: 17/291,378

(22) PCT Filed: Nov. 7, 2019

(86) PCT No.: PCT/EP2019/080615
§ 371 (c)(1),
(2) Date: May 5, 2021

(87) PCT Pub. No.: WO2020/094816
PCT Pub. Date: May 14, 2020

(65) Prior Publication Data
US 2022/0033975 A1  Feb. 3, 2022

(30) Foreign Application Priority Data

Nov. 8, 2018  (EP) .................................... 18205134

(51) Int. Cl.
*C23C 14/06* (2006.01)
*C23C 28/04* (2006.01)
(Continued)

(52) U.S. Cl.
CPC .......... *C23C 28/046* (2013.01); *C23C 14/025* (2013.01); *C23C 14/0605* (2013.01);
(Continued)

(58) Field of Classification Search
CPC . C23C 14/05; C23C 14/0605; C23C 14/0635; C23C 14/34; B23B 27/14; B23B 27/148; F16J 9/26
(Continued)

(56) References Cited

U.S. PATENT DOCUMENTS 6,325,385 B1 * 12/2001 Iwashita ............... F16J 9/26
277/444
8,728,621 B2 * 5/2014 Oohira ................ C23C 14/35
204/192.15
(Continued)

FOREIGN PATENT DOCUMENTS

CN         106637119 A     5/2017
JP         2004-010923   *  1/2004
(Continued)

OTHER PUBLICATIONS

Neuville, S., "New application perspective for tetrahedral amorphous carbon coatings," *QScience Connect* 2014(1):1-27, Hamad Bin Khalifa University Press, Qatar (2014).
(Continued)

*Primary Examiner* — Seth Dumbris
*Assistant Examiner* — Kim S. Horger
(74) *Attorney, Agent, or Firm* — Sterne, Kessler, Goldstein & Fox P.L.L.C.

(57) ABSTRACT

A substrate is coated with a multi-layer coating, comprising in order: (i) a first functional layer comprising ta-C, (ii) a second functional layer comprising ta-C, (iii) (a) a third functional layer comprising ta-C and a first intermediate layer comprising a carbide of a first element, or (b) a first intermediate layer comprising a carbide of a first element, and a second intermediate layer comprising the first element, wherein the ta-C has a hydrogen content less than 10% and an sp2 content less than 30%; wherein (i) the Young's (Continued)

modulus or (ii) the hardness or (iii) both the Young's modulus and the hardness independently stay the same or increase from layer to layer in (iii) (a) from the first intermediate layer to the first functional layer, or in (iii) (b) from the second intermediate layer to the first functional layer.

20 Claims, 2 Drawing Sheets

(51) Int. Cl.
| | |
|---|---|
| C23C 14/02 | (2006.01) |
| C23C 14/32 | (2006.01) |
| C23C 14/34 | (2006.01) |
| C23C 28/00 | (2006.01) |

(52) U.S. Cl.
CPC ........ *C23C 14/0635* (2013.01); *C23C 14/325* (2013.01); *C23C 14/3407* (2013.01); *C23C 28/36* (2013.01)

(58) Field of Classification Search
USPC ........................................................ 428/409
See application file for complete search history.

(56) References Cited

U.S. PATENT DOCUMENTS

| | | |
|---|---|---|
| 2004/0038033 A1 | 2/2004 | Massler et al. |
| 2010/0186834 A1 | 7/2010 | Brondum et al. |
| 2011/0195265 A1* | 8/2011 | Oohira ................ C23C 14/0635 204/192.16 |
| 2012/0248711 A1* | 10/2012 | Iwashita ................ C23C 14/16 277/440 |
| 2015/0240944 A1 | 8/2015 | Ivanov et al. |
| 2016/0076141 A1* | 3/2016 | Hirota ................ C23C 14/0605 427/523 |
| 2017/0122249 A1* | 5/2017 | Procopio ................ C23C 28/34 |
| 2018/0245200 A1* | 8/2018 | Shinohara .................. F16J 9/26 |

FOREIGN PATENT DOCUMENTS

| | | | |
|---|---|---|---|
| JP | 2004-169137 | * | 6/2004 |
| WO | WO-2007020138 A1 | | 2/2007 |

OTHER PUBLICATIONS

Tong, H. H., et al., "Fabrication and characteristics of ta-C biomaterial coatings on Ti—6Al—4V using metal plasma immersion ion implantation and deposition," *Current Applied Physics* 1(2-3):197-201, Elsevier, Netherlands (Aug. 2001).

Teo, E. H. T., et al., "Thermal stability of nonhydrogenated multilayer amorphous carbon prepared by the filtered cathodic vacuum arc technique," *Journal of Vacuum Science & Technology A* 25(3):421-424, AIP Publishing LLC on behalf of the AVS Science and Technology Society, United States (2007).

Co-pending U.S. Appl. No. 17/283,590, inventors Shi, X., et al., filed Oct. 8, 2019 (Not Yet Published).

Co-pending U.S. Appl. No. 17/414,843, inventors Shi, X., et al., filed Dec. 17, 2019 (Not Yet Published).

Co-pending U.S. Appl. No. 17/291,380, inventor Shi, X., filed Nov. 7, 2019 (Not Yet Published).

* cited by examiner

TA-C BASED COATINGS WITH IMPROVED HARDNESS

INTRODUCTION

This present invention relates to carbon coatings with improved hardness and wear-resistance and methods for producing such coatings.

BACKGROUND TO THE INVENTION

A large variety of deposition techniques are used to coat substrates. Vapor deposition technology is typically used to form thin film deposition layers in various types of applications, including microelectronic applications and heavy-duty applications. Such deposition technology can be classified in two main categories. A first category of such deposition technology is known as Chemical Vapor Deposition (CVD). CVD generally refers to deposition processes occurring due to a chemical reaction. Common examples of CVD processes include semiconducting Si layer deposition, epitaxy and thermal oxidation.

A second category of deposition is commonly known as Physical Vapor Deposition (PVD). PVD generally refers to the deposition of solid substances occurring as a result of a physical process. The main concept underlying the PVD processes is that the deposited material is physically transferred onto the substrate surface via direct mass transfer. Typically, no chemical reaction takes place during the process and the thickness of the deposited layer is independent of chemical reaction kinetics as opposed to CVD processes.

Sputtering is a known physical vapor deposition technique for depositing compounds on a substrate, wherein atoms, ions or molecules are ejected from a target material (also called the sputter target) by particle bombardment so that the ejected atoms or molecules accumulate on a substrate surface as a thin film.

Another known physical vapor deposition technique is cathodic vapor arc deposition methods. In this method, an electric arc is used to vaporize material from a cathode target. Consequently, the resulting vaporized material condenses on a substrate to form a thin film of coating.

Amorphous carbon is a free, reactive form of carbon which does not have a crystalline form. Various forms of amorphous carbon films exist and these are usually categorised by the hydrogen content of the film and the $sp^2:sp^3$ ratio of the carbon atoms in the film.

In an example of the literature in this field, amorphous carbon films are categorised into 7 categories (see table below taken from "Name Index of Carbon Coatings" from Fraunhofer Institut Schich- and Oberflächentechnik):

Tetrahedral hydrogen-free amorphous carbon (ta-C) is characterised in that it contains little or no hydrogen (less than 5% mol, typically less than 2% mol) and a high content of $sp^3$ hybridised carbon atoms (typically greater than 80% of the carbon atoms being in the $sp^3$ state).

Whilst the term "diamond-like carbon" (DLC) is sometimes used to refer to all forms of amorphous carbon materials, the term as used herein refers to amorphous carbon materials other than ta-C. Common methods of DLC manufacture use hydrocarbons (such as acetylene), hence introducing hydrogen into the films (in contrast to ta-C films in which the raw material is typically hydrogen free high purity graphite).

In other words, DLC typically has an $sp^2$ carbon content of greater than 50% and/or a hydrogen content of 20% mol and above. The DLC may be undoped or doped with metals or non-metals (see table above).

Conventional DLC coatings can have a hardness value of up to about 2000 HV (Vickers hardness) and thickness of approximately 3 μm or greater. For example, automobile (e.g. engine) components coated with DLC can be obtained from Oerlikon Balzers, HEF USA and IHI Ionbond AG. However, their hardness is limited and the thicknesses of these coatings limit their applications and are prohibitive for some precision devices.

DLC can similarly have acceptable hardness and friction coefficient for cutting tools and other uses. The hardness of DLC coatings currently on the market for tools is again around 2000 H V Vickers hardness for a thickness of about 3 microns. But for some precision devices, this thickness will limit its application. Therefore, there is a need in the market to develop a thinner but equally wear-resistant diamond-like film.

US 2004/0038033 A1 describes coating a substrate with a metallic/silicon adhesion layer, a metal carbide/silicon carbide transition layer and a DLC layer. In the examples in this document, chromium is selected as the metal for the adhesion layer.

WO 2007/020138 refers to a coated substrate comprising a substrate, an intermediate later and a tetrahedral carbon layer where the Young's modulus of the tetrahedral carbon layer must be greater than that of the intermediate layer.

US 2015/240944 discloses a multi-layer coating comprising a carbide or nitride layer followed by further DLC layers.

US 2010/186834 discloses a substrate comprising alumina, coated with a first material comprising titanium and a second material comprising carbon wherein at least 40% of the carbon is tetrahedrally bonded.

| Amorphous Carbon Films | | | | | | |
|---|---|---|---|---|---|---|
| Hydrogen-Free | | | Hydrogenated | | | |
| Unmodified | | Modified With metals | Unmodified | | Modified with Metals | Non-metals |
| $sp^2$ | $sp^3$ | $sp^2$ | $sp^2$ or $sp^3$ | $sp^3$ | $sp^2$ | $sp^2$ |
| Hydrogen-free amorphous carbon | Tetrahedral, hydrogen-free amorphous carbon | Metal-containing, hydrogen-free amorphous carbon | Hydrogenated amorphous carbon | Tetrahedral, hydrogenated amorphous carbon | Metal-containing, hydrogenated amorphous carbon | Non-metal containing hydrogenated amorphous carbon |
| a-C | ta-C | a-C:Me | a-C:H | ta-C:H | a-C:H:Me | a-C:H:X |

Whilst greater hardness values can be obtained using ta-C instead of DLC, these layers are often brittle and easily delaminate from the substrate. Thinner but harder coatings which still have good adhesion can not currently be made. There is a need for thinner but equally or more wear-resistant carbon coatings.

An object of the invention is to provide an alternative to existing carbon-containing coatings, preferably to provide improved coatings.

The Invention

The inventor of the present application has found that by selecting appropriate intermediate layers for adhering ta-C to a substrate, coatings of increased hardness can be obtained which are also wear resistant and do not easily delaminate. Such coatings can have increased hardness and reduced thickness compared to conventional coatings which make use of DLC.

Accordingly, the invention provides a substrate coated with a multi-layer coating, comprising in order:
(i) a first functional layer comprising ta-C,
(ii) a second functional layer comprising ta-C,
(iii) (a) a third functional layer comprising ta-C and a first intermediate layer comprising a carbide of a first element, or (b) a first intermediate layer comprising a carbide of a first element, and a second intermediate layer comprising the first element,
wherein the ta-C has a hydrogen content less than 10% and an $sp^2$ content less than 30%;
wherein (i) the Young's modulus or (ii) the hardness or (iii) both the Young's modulus and the hardness independently stay the same or increase from layer to layer in (iii) (a) from the first intermediate layer to the first functional layer, or in (iii) (b) from the second intermediate layer to the first functional layer.

Accordingly, in certain embodiments the present invention provides a substrate coated with a multi-layer coating, comprising in order:
a first functional layer comprising ta-C,
a second functional layer comprising ta-C,
optionally, one or more further functional layers comprising ta-C,
a first intermediate layer comprising a carbide of a first element,
a second intermediate layer comprising the first element,
optionally, one or more further intermediate layers, and the substrate,
wherein (i) the Young's modulus or (ii) the hardness or (iii) both the Young's modulus and the hardness independently stay the same or increase from layer to layer from the second intermediate layer to the first functional layer.

Further provided in certain embodiments is a coating for a substrate, comprising in order:
a first functional layer comprising ta-C,
a second functional layer comprising ta-C,
optionally, one or more further functional layers comprising ta-C,
a first intermediate layer comprising a carbide of a first element,
a second intermediate layer comprising the first element, and
optionally, one or more further intermediate layers,
wherein (i) the Young's modulus or (ii) the hardness or (iii) both the Young's modulus and the hardness independently stay the same or increase from layer to layer from the second intermediate layer to the first functional layer.

Also provided is a method of coating a substrate, comprising depositing onto the substrate a coating comprising in order:
(i) (a) a first intermediate layer comprising a carbide of a first element and a third functional layer comprising ta-C, or (b) a second intermediate layer comprising a first element, and a first intermediate layer comprising a carbide of the first element,
(ii) a second functional layer comprising ta-C,
(iii) a first functional layer comprising ta-C,
wherein the ta-C has a hydrogen content less than 10% and an $sp^2$ content less than 30%;
wherein (i) the Young's modulus or (ii) the hardness or (iii) both the Young's modulus and the hardness independently stay the same or increase from layer to layer in (iii) (a) from the first intermediate layer to the first functional layer, or in (iii) (b) from the second intermediate layer to the first functional layer.

Also provided in certain embodiments is a method of coating a substrate, comprising depositing onto the substrate a coating comprising in order:
optionally, one or more further intermediate layers,
a second intermediate layer comprising a first element,
a first intermediate layer comprising a carbide of the the first element,
optionally, one or more further functional layers comprising ta-C,
a second functional layer comprising ta-C, and
a first functional layer comprising ta-C,
wherein (i) the Young's modulus or (ii) the hardness or (iii) both the Young's modulus and the hardness independently stay the same or increase from layer to layer from the second intermediate layer to the first functional layer.

Gradual increase in Young's modulus and hardness in the transition from the layer adjacent the substrate to the uppermost functional layer provides a hard coating securely adhered to the substrate. The transition is generally across at least 4 layers and may be across a greater number; in examples, at least 5 or 6 layers make up specific coatings of the invention.

Thus, the invention enables coating of a substrate with a thin, hard coating that shows good hardness and wear resistance, as illustrated by the testing of embodiments of the invention described in more detail below.

DETAILED DESCRIPTION OF THE INVENTION

As discussed above, the term "tetrahedral amorphous carbon" (ta-C or TAC) as used herein refers to amorphous carbon having a low hydrogen content and a low $sp^2$ carbon content.

Ta-C is a dense amorphous material described as composed of disordered $sp^3$, interlinked by strong bonds, similar to those that exist in disordered diamond (see Neuville S, "New application perspective for tetrahedral amorphous carbon coatings", QScience Connect 2014:8, http://dx.doi.org/10.5339/connect.2014.8). Due to its structural similarity with diamond, ta-C also is a very hard material with hardness values often greater than 30 GPa.

For example, the ta-C may have a hydrogen content less than 10%, typically 5% or less, preferably 2% or less (for example 1% or less). The percentage content of hydrogen provided here refers to the molar percentage (rather than the percentage of hydrogen by mass). The ta-C may have an $sp^2$ carbon content less than 30%, typically 20% or less, preferably 15% or less. Preferably, the ta-C may have a hydrogen content of 2% or less and an $sp^2$ carbon content of 15% or less. The ta-C is preferably not doped with other materials (either metals or non-metals).

By contrast, the term "diamond-like carbon" (DLC) as used herein refers to amorphous carbon other than ta-C. Accordingly, DLC has a greater hydrogen content and a greater $sp^2$ carbon content than ta-C. For example, the DLC may have a hydrogen content of 20% or greater, typically 25% or greater, for example 30% or greater. The percentage content of hydrogen provided here again refers to the molar percentage (rather than the percentage of hydrogen by mass). The DLC may have an $sp^2$ carbon content of 50% or greater, typically 60% or greater. Typically, the DLC may have a hydrogen content of greater than 20% and an $sp^2$ carbon content of greater than 50%. The DLC may be undoped or doped with metals and/or non-metals.

The invention advantageously provides deposited ta-C coatings that are not thick but are hard and have high wear resistance.

As per the invention, a substrate coated with a multi-layer coating comprises in order:
 (i) a first functional layer comprising ta-C,
 (ii) a second functional layer comprising ta-C,
 (iii) (a) a third functional layer comprising ta-C and a first intermediate layer comprising a carbide of a first element, or (b) a first intermediate layer comprising a carbide of a first element, and a second intermediate layer comprising the first element,
 wherein the ta-C has a hydrogen content less than 10% and an $sp^2$ content less than 30%;
 wherein (i) the Young's modulus or (ii) the hardness or (iii) both the Young's modulus and the hardness independently stay the same or increase from layer to layer in (iii) (a) from the first intermediate layer to the first functional layer, or in (iii) (b) from the second intermediate layer to the first functional layer.

In (iii) (a) the coating suitably comprises one or more further intermediate layers between the first intermediate layer and the substrate.

In (iii) (b) the coating suitably comprises one or more further functional layers comprising ta-C between the second functional layer and the first intermediate layer In (iii) (b) the coating suitably comprises one or more further intermediate layers between the second intermediate layer and the substrate.

Preferred embodiments are in accordance with option (iii) (b) above, namely as per the invention, a substrate coated with a multi-layer coating comprises in order:
 a first functional layer comprising ta-C,
 a second functional layer comprising ta-C,
 optionally, one or more further functional layers comprising ta-C,
 a first intermediate layer comprising a carbide of a first element,
 a second intermediate layer comprising the first element,
 optionally, one or more further intermediate layers, and the substrate.

Further preferred embodiments are in accordance with option (iii) (a), namely a substrate coated with a multi-layer coating, comprises in order:
 a first functional layer comprising ta-C,
 a second functional layer comprising ta-C,
 a third functional layer comprising ta-C,
 a first intermediate layer comprising a carbide of a first element, or (b) a first intermediate layer comprising a carbide of a first element, and a second intermediate layer comprising the first element, and
 the substrate.

The functional layers comprise ta-C, and preferably consist of ta-C. There may be several such functional layers, with Young's modulus and/or hardness remaining the same or increasing from layer to layer, peaking or culminating with the properties of an uppermost functional layer, usually the one exposed on the outside of the coated substrate. Testing e.g. of coating hardness of the coated substrate (as reported e.g. below in examples) takes place on this end product, though the Young's modulus and hardness of individual layers can also be tested or otherwise determined, e.g. theoretically or by testing an unfinished product, prior to application/deposition of further or final layer(s). The total thickness of the functional layers comprising ta-C is typically 3 µm or less, preferably 2 µm or less, for example 1 µm or less.

The first intermediate layer is described as 'intermediate' in that it is the layer, or one of the layers, intermediate between a ta-C layer and the substrate. In the coated substrate the first element may be W, Si, Cr, Ni or Ti or a mixture of two or more of those elements. The first intermediate layer hence comprises one or more elements and usually comprises or consists of the first element carbide. The first element may be a metal, and the first intermediate layer may hence comprise or consist of the first metal carbide. A preferred first metal is W, as used in examples herein. Another preferred metal, as described in embodiments, is Ti. The first element may be a non-metal; a further preferred first element is Si, described in other embodiments. Other elements are also suitable provided the Young's modulus and hardness of the resulting layer meets the requirement of being a step between respective layers in the coating. The total thickness of the first intermediate layer is typically 1 µm or less, preferably 0.5 µm or less, for example 0.2 µm or less.

The second intermediate layer comprises the first element, e.g. the first metal, so that the first element is contained within both first and second intermediate layers, as a carbide in the first and usually as a non-carbide compound in the second. There is as a result continuity between these layers, which generally means Young's modulus and hardness can be matched more easily and there is good adherence between the layers. Thus, also generally in the coatings, the second intermediate layer further comprises a second element, different from the first element. Most commonly, the second intermediate layer consists of a compound comprising the first and second elements, optionally consisting of the first and second elements and optionally as a compound with a third element, e.g. a gas, e.g. nitrogen or oxygen. The second element may be W, Si, Cr, Ni or Ti; it is preferably Cr, Ti or Si or a compound of two or more of the elements). In examples below, Cr was used. The total thickness of the second intermediate layer is typically 1 µm or less, preferably 0.7 µm or less, for example 0.5 µm or less.

The second intermediate layer (or if present one of the optional, e.g. third or further intermediate layers) may be a layer that is applied to the substrate, e.g. as an adhesion or seed layer. Good adhesion to the substrate is desirable and it is found that layers with good substrate adhesion are often not those that are hardest or with highest Young's modulus, as seed layer properties are more suitably closer to those of the substrate. The invention addresses this by providing the further layers to gradually increase the two properties and confer overall improved such properties to the finished coating while retaining good adhesion.

While the second intermediate layer may be deposited onto the surface of the substrate, the coated substrate typically comprises at least a third intermediate layer between the substrate and the second intermediate layer, the third intermediate layer comprising an element, e.g. a metal. Continuity as described above between layers is preferred, and so it is preferred that the third intermediate layer comprises the second element. The second element can be W, Si, Cr, Ni or Ti; the third intermediate layer can be compound with a further (different) element, e.g. N, W, Si, Cr, Ni or Ti; the third intermediate layer can alternatively comprise or more preferably consist of the second element. The total thickness of the third intermediate layer is typically 1 μm or less, preferably 0.5 μm or less, for example 0.3 μm or less.

When the substrate is metallic (e.g. steel), it is preferable that the intermediate layer adjacent the substrate is also metallic or comprises a metallic element in order to provide metal-metal bonding between the metallic substrate and the intermediate layer to promote adhesion.

In embodiments of the invention the Young's modulus stays the same or increases from layer to layer between the second intermediate layer and the first functional layer. In addition, the Young's modulus preferably increases over any set of three adjacent layers in the coating, and more preferably increases from the adhesion or seed layer to the final, uppermost functional layer. Suitably, the average increase in the Young's modulus is 10 GPa per layer or more, or 15 GPa per layer or more, or 20 GPa per layer, or more. In examples below, the average increase was approximately 15, 18, 22, 32 and 41 GPa respectively per layer (e.g. 45 GPa increase over 4 layers is an average of 15 GPa as there are three additional layers on top of the first layer).

An aim of the invention is to provide hard coatings, for many applications and including for tools, engine components etc. Coated substrates of the invention preferably have a coating with a hardness of at least 2000 HV, more preferably 2500 HV or more, 3000 HV or more, 3500 HV or more, or 4000 HV or more. Coatings with a wide range of measured hardness values within these ranges have been made (see examples below), including coatings with hardness of approximately 5000 HV. For different end applications, according sometimes to user choice, different hardness may be appropriate. While hardness of 5000 HV is achievable, it can also be that slightly thicker but less hard coatings are preferred for some uses (for example, uses where wear resistance is more important than hardness). To achieve the end hardness, hardness increases through the coating as described. Generally, the ta-C layer in the functional layer adjacent the first intermediate layer, which ta-C layer may also be referred to as being closest to the substrate, is a softer ta-C layer, enabling hardness to transition from seed/intermediate layers through this initial ta-C layer to the uppermost, outer ta-C layer. This closest ta-C layer may have a hardness of 1000 HV or more. This provides a base for further hardness increase through to the top functional layer. Increase in hardness is suitably achieved by variation in the ta-C deposition parameters, e.g. when using FCVA by adjustment of substrate bias. The ta-C layer (functional layer) adjacent the first intermediate layer may also have a hardness of 1200 HV or more, preferably 1600 HV or more, preferably 2000 HV or more, or 2300 HV or more.

In embodiments of the invention the hardness stays the same or increases from layer to layer from the second intermediate layer to the first functional layer. In addition, the hardness preferably increases over any set of three adjacent layers in the coating, and increases from the adhesion or seed layer to the final, uppermost functional layer. Suitably, the average increase in hardness is at least 200 HV per layer, usually at least 300 HV per layer, e.g. at least 350 HV per layer or at least 400 HV per layer. In embodiments with an overall hardness increase across the ta-C layers in excess of 1200 HV hardness may increase at least 600 HV per layer. The average increase varies according to the total number of layers and the end hardness of the top layer. In examples to date the average hardness increases were 416, 362, 350, 569 and 813 HV per layer.

In preferred embodiments of the invention, some of which are illustrated in the examples, both the Young's modulus and the hardness stays the same or increases from layer to layer from the second intermediate layer to the first functional layer. More preferably, both the Young's modulus and the hardness increase from the second intermediate layer to the first functional layer.

As examples of coated substrates of the invention, particular embodiments are A-C:

(A)
A substrate coated with a multi-layer coating, the coating comprising in order:
  a first functional layer comprising ta-C,
  a second functional layer comprising ta-C,
  optionally, one or more further functional layers comprising ta-C,
  a first intermediate layer comprising tungsten carbide,
  a second intermediate layer comprising tungsten, and
  optionally, one or more further intermediate layers.

(B)
A substrate coated with a multi-layer coating, the coating comprising in order:
  a first functional layer comprising ta-C,
  a second functional layer comprising ta-C,
  optionally, one or more further functional layers comprising ta-C,
  a first intermediate layer comprising titanium carbide,
  a second intermediate layer comprising titanium, and
  optionally, one or more further intermediate layers.

(C)
A substrate coated with a multi-layer coating, the coating comprising in order:
  a first functional layer comprising ta-C,
  a second functional layer comprising ta-C,
  optionally, one or more further functional layers comprising ta-C,
  a first intermediate layer comprising silicon carbide,
  a second intermediate layer comprising silicon, and
  optionally, one or more further intermediate layers.

As described throughout, (i) the Young's modulus or (ii) the hardness or (iii) both the Young's modulus and the hardness independently stay the same or increase from layer to layer from the second intermediate layer to the first functional layer.

Further specific coated substrates according to the invention, comprise, in order:
  a ta-C containing layer of hardness 3000-6000 Hv,
  a ta-C containing layer of hardness 2000-2999 Hv,
  a first intermediate layer comprising tungsten carbide of hardness 1340-1832 HV,
  a second intermediate layer comprising chromium tungstide carbide (CrWC) of hardness 900-1280 HV, and
  a further intermediate layer comprising chromium of hardness 750-950 Hv and adjacent the substrate.

Still further specific coated substrates according to the invention, comprise, in order:
  a ta-C containing layer of hardness 3200-3800 HV,
  a ta-C containing layer of hardness 2901-3199 HV,
  a ta-C containing layer of hardness 2700-2900 HV, and an intermediate layer comprising silicon carbide of hardness 500-900 HV and adjacent the substrate.

Particular embodiments of the invention comprise a first intermediate layer comprising WC, a second intermediate layer comprising CrW and a third intermediate (or seed) layer comprising Cr.

Specific coated substrates according to the invention, comprise, in order:
- a ta-C-containing layer of hardness 2000 HV or greater,
- a ta-C-containing layer of hardness 1200 HV or greater,
- a first intermediate layer comprising tungsten carbide,
- a second intermediate layer comprising chromium tungstide, and
- a further intermediate layer comprising chromium and adjacent the substrate, wherein the first functional layer has a hardness at least 300 HV greater than the second functional layer.

Further particular embodiments of the invention comprise a first intermediate layer comprising SiC, a second intermediate layer comprising $Si_3N_4$, a third intermediate layer comprising CrSi and a fourth intermediate (or seed) layer comprising Cr.

Coatings of the invention can be made with useful thickness, and can be the same thickness as or thinner than known DLC based coatings but with improved hardness. The total coating thickness can be <=5 microns, <=3 microns or <=2 microns. Some preferred hard coatings have high hardness and thickness of 1.5 microns or less. Within the coating each layer is, independently, generally 2 microns or less thick, preferably 1.5 microns or less thick, more typically 1 micron or less thick, suitably 0.7 microns or less, or 0.5 microns or less or 0.3 microns or less and may be thinner for coatings of the invention with reduced overall thickness. Within the coating each layer is, also independently, generally at least 0.02 microns or more thick, suitably 0.05 microns or more thick, or 0.1 microns or more thick or 0.2 microns or more thick and may be thicker according to overall coating thickness. Layer thicknesses are usually fairly similar between each of the intermediate/seed layers and are separately fairly similar between the respective ta-C-containing layers with increasing Young's modulus and/or hardness.

Also provided by the invention are methods for coating substrates. Accordingly, the invention provides a method of coating a substrate, comprising depositing onto the substrate a coating, wherein the coating comprises in order:
- a first functional layer comprising ta-C,
- a second functional layer comprising ta-C,
- optionally, one or more further functional layers comprising ta-C,
- a first intermediate layer comprising a carbide of a first element,
- a second intermediate layer comprising the first element,
- optionally, one or more further intermediate layers, and the substrate, wherein (i) the Young's modulus or (ii) the hardness or (iii) both the Young's modulus and the hardness independently stay the same or increase from layer to layer from the second intermediate layer to the first functional layer.

As will be appreciated, methods of the invention comprise depositing the optional, one or more further intermediate layers (if present), the second intermediate layer comprising the first element, the first intermediate layer comprising a carbide of a first element, and then the functional ta-C-containing layers. The methods deposit coatings with optional and preferred features as described elsewhere herein in relation to coatings of the invention.

Choice of substrate material is broad, and many substrates made of a wide range of materials can be coated. The substrate is usually metallic and generally is or comprises a metal or an alloy. Steels are suitable substrates, e.g. steel, stainless steel, HSS, tool steel and alloy steel. Ti or its alloys, Al or its alloys, ceramics such as $Al_2O_3$, $ZrO_2$, $Si_3N_4$, SiC, and plastics such as PEEK, POM, LCP, ABS, PC. Articles are generally made of the substrate and then have a coating of the invention applied/deposited.

Conventional CVD and PVD methods, specifically CVA and FCVA processes are known and used for a wide range of substrates and the methods of the invention are similarly suitable for coating a wide range of substrates. Solids, both conducting and non-conducting, are generally suitable and seed layers and adhesion layers can be used to improve coating adhesion and strength, and to render surfaces amenable to being coated. Substrates made of metal, alloy, ceramics and mixtures thereof can be coated. Metal and composite substrates can be coated, especially steel and varieties of steel as well as and parts, tools, components etc made thereof. Specific examples of preferred substrates include tools, cutting tools, tooling, industrial machines and components therefor. It is further and separately preferred that the substrate is an engine component, such as a piston ring, a piston pin, a cam shaft, a tappet, a lift valve, an injection nozzle or another component.

Coatings of the invention are multilayered and the respective layers may independently be deposited using a range of known and conventional deposition techniques, including CVD, PVD, magnetron sputtering and multi-arc ion plating. Sputtering is one suitable method, especially for the intermediate layers (including a seed layer). PVD is suitably used for the functional layers, e.g. sputtering; in examples CVA is used. The CVA process is typically a filtered cathodic vacuum arc (FCVA) process, e.g. as described below. Apparatus and methods for FCVA coatings are known and can be used as part of the methods of the invention. The FCVA coating apparatus typically comprises a vacuum chamber, an anode, a cathode assembly for generating plasma from a target and a power supply for biasing the substrate to a given voltage. The nature of the FCVA is conventional and not a part of the invention.

Young's modulus is a conventionally used and understood mechanical property that measures the stiffness of a solid material. It defines the relationship between stress (force per unit area) and strain (proportional deformation) in a material in the linear elasticity regime of a uniaxial deformation. It is measured using standard methods and apparatus, conventionally by nanoindentation (see e.g. D. Tabor: The Hardness of Metals (Oxford University Press, Oxford, U K, 2000 and Tribol Lett (2017) 65:23 DOI 10.1007/s11249-016-0805-5).

Hardness is suitably measured using the Vickers hardness test (developed in 1921 by Robert L. Smith and George E. Sandland at Vickers Ltd; see also ASTM E384-17 for standard test), which can be used for all metals and has one of the widest scales among hardness tests. The unit of hardness given by the test is known as the Vickers Pyramid Number (HV) and can be converted into units of pascals (GPa). The hardness number is determined by the load over the surface area of the indentation used in the testing. As examples. Martensite a hard form of steel has HV of around 1000 and diamond can have a HV of around 10,000 HV (around 98 GPa). Hardness of diamond can vary according to precise crystal structure and orientation but hardness of from about 90 to in excess of 100 GPa is common.

In describing the invention a hardness and/or Young's modulus value is given, as a value or a range of values or as a typical range of values. The value is in some cases as measured directly on the finished, coated substrate; this is apparent from the context. Hardness and/or Young's modulus of an individual layer within a multi-layer coating generally indicates the value when that layer is deposited using the given deposition conditions as a single layer on a steel substrate. If coating adhesion to the substrate is poor then the hardness and/or Young's modulus will generally indicate the hardness and/or Young's modulus of that layer deposited onto a seed layer (typically chromium) deposited onto the substrate. The values given accurately reflect the hardness and/or Young's modulus within the individual layers of the multi-layer coating.

The invention advantageously provides high hardness and wear-resistant ta-C-based coatings. Compared to known DLC coatings in the market, thickness can be reduced for comparable and even increased hardness, significant hardness and/or wear-resistance can be achieved, thickness for acceptable coatings can be reduced e.g. below 2 microns and thinner, and/or hardness can be is increased e.g. to about 2500 HV and above or about 4000 HV and above to maintain wear resistance.

BRIEF DESCRIPTION OF THE DRAWINGS

The invention is now illustrated with reference to the accompanying drawings in which.

COMPARATIVE EXAMPLES

Four prior art coatings, all commercially available, were used (named Comparative Coatings 1 to 4) as comparative examples, with structures as set out below:

Comparative Coating 1

Figure 1:
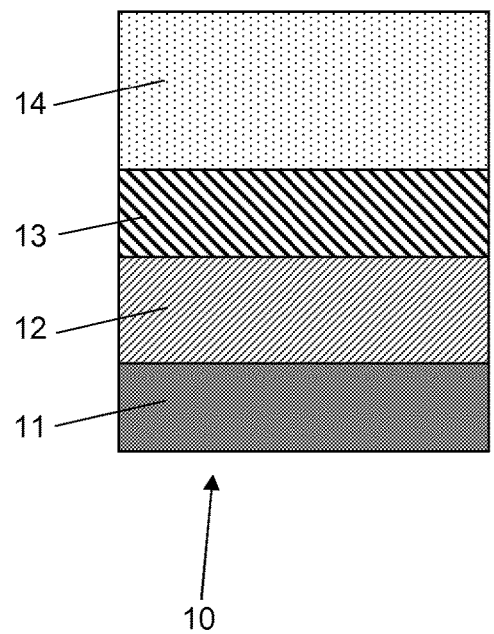
FIG. 1 shows is a schematic diagram showing the structure of Comparative Coating 1 (not to scale).

A coated piston (10) was obtained from a commercial supplier, with properties (see FIG. 1):

| Layer | Thickness |
|---|---|
| DLC (14) | 1.413 μm |
| CrC (13) | 0.606 μm |
| CrN (~50% N) (12) | 0.714 μm |
| Substrate (11) | |
| Total Thickness | ~2.7 μm |

Comparative Coating 2

Figure 2:
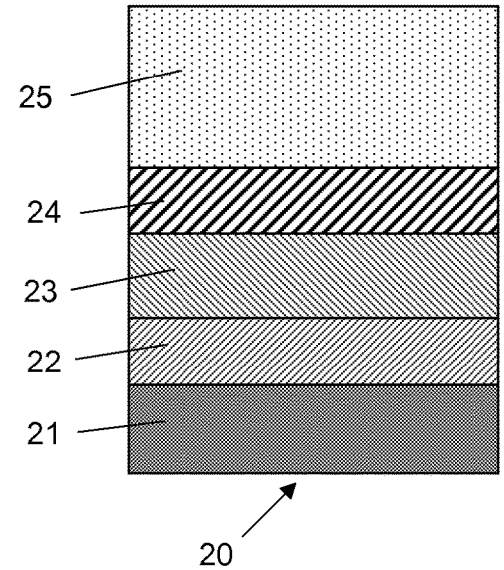
FIG. 2 shows is a schematic diagram showing the structure of Comparative Coating 2 (not to scale).

A coated plunger (20) was obtained from a commercial supplier, with properties (see FIG. 2):

| Layer | Thickness |
|---|---|
| DLC (25) | 1.187 μm |
| CrC (24) | 0.188 μm |
| CrN (~50% N) (23) | 0.569 μm |
| CrN (~20% N) (22) | 0.219 μm |
| Substrate (21) | |
| Total Thickness | ~2.2 μm |

Comparative Coating 3

Figure 3:
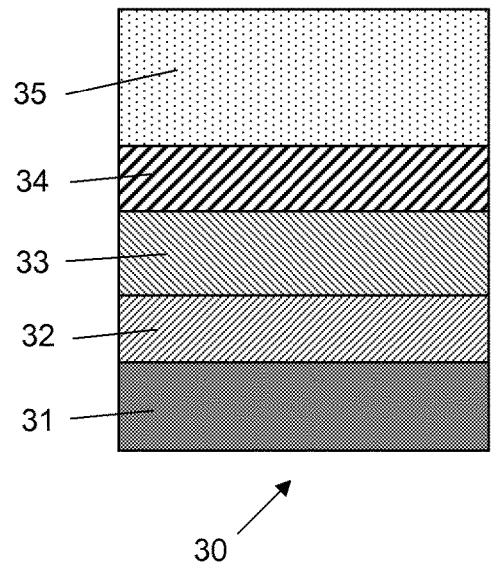
FIG. 3 shows is a schematic diagram showing the structure of Comparative Coating 3 (not to scale).

A coated tappet (30) was obtained from a commercial supplier, with properties (see FIG. 3):

| Layer | Thickness |
|---|---|
| DLC (35) | 2.806 μm |
| Si (34) | 0.110 μm |
| CrN (~20% N) (33) | 0.504 μm |
| Cr (32) | 0.234 μm |
| Substrate (31) | |
| Total Thickness | ~3.7 μm |

Comparative Coating 4

Figure 4:
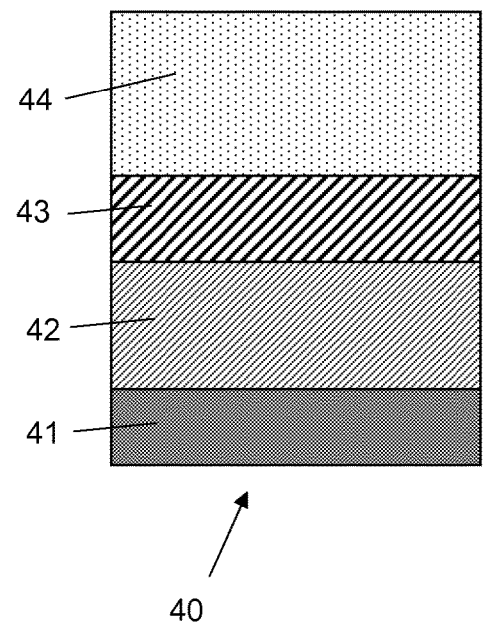
FIG. 4 shows is a schematic diagram showing the structure of Comparative Coating 4 (not to scale).

A second coated tappet (40) was obtained from a commercial supplier, with properties (see FIG. 4):

| Layer | Thickness |
|---|---|
| DLC (44) | 1.702 μm |
| WC (43) | 0.332 μm |
| CrN (~20% N) (42) | 1.817 μm |
| Substrate (41) | |
| Total Thickness | ~3.8 μm |

Examples

Figure 5:
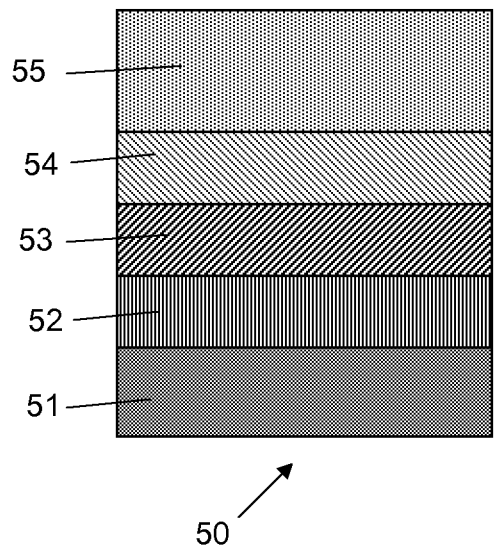
FIG. 5 shows is a schematic diagram showing the structure of Coating A of the invention (not to scale).

Two coatings of the invention were prepared as described below:

Coating A (50, see FIG. 5)

| Layer | Thickness |
|---|---|
| Ta-C (55) | 1.5 μm |
| WC (54) | 0.2 μm |
| CrW (53) | 0.5 μm |
| Cr (52) | 0.3 μm |
| Substrate (51) | |
| Total Thickness (determined by CAR2) | ~2.5 μm |

Figure 6:
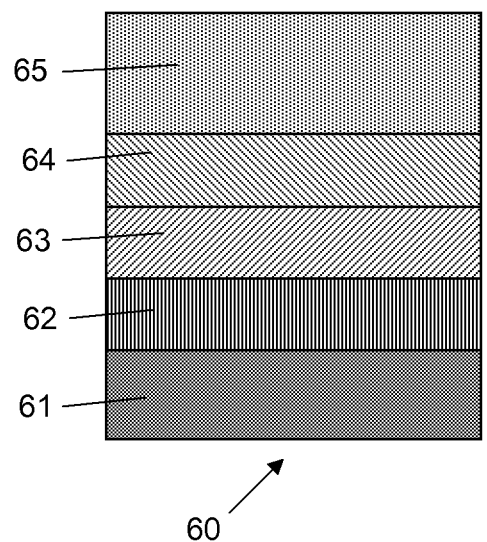
FIG. 6 shows is a schematic diagram showing the structure of Coating B of the invention (not to scale).

Coating B (60, see FIG. 6)

| Layer | Thickness |
|---|---|
| Ta-C (65) | 0.8 μm |
| WC (64) | 0.1 μm |
| CrW (63) | 0.1 μm |
| Cr (62) | 0.2 μm |

-continued

| Layer | Thickness |
|---|---|
| Substrate (61) | |
| Total Thickness (determined by CAR2) | ~1.2 μm |

In more detail, onto SUS304 HSS substrates a seed layer of Cr was sputtered, followed by subsequent layers in order of CrW, then WC with the thicknesses in the tables above. Onto these intermediate layers was then deposited multi-layer functional ta-C coatings (4 for A and 3 for B) using FCVA apparatus. Depositions parameters and Young's modulus and hardness of the layers were as follows:—

Coating A

| Layer | Bias/ material* | Hardness Range Low | Hardness Range High | Typical value | Young's modulus Range Low | Young's modulus Range High | Typical value |
|---|---|---|---|---|---|---|---|
| ta-C 4 | 600 V/15% | 2700 | 3100 | 2800 | 325 | 355 | 344 |
| ta-C 3 | 800 V/15% | 2450 | 2870 | 2500 | 305 | 330 | 310 |
| ta-C 2 | 1000 V/15% | 2100 | 2500 | 2300 | 262 | 310 | 280 |
| ta-C 1 | 1000 V/20% | 1650 | 1927 | 1850 | 220 | 250 | 245 |
| SPT 3 | WC | 1340 | 1832 | 1627 | 237 | 280 | 245 |
| SPT 2 | CrW | 900 | 1280 | 1050 | 216 | 260 | 235 |
| SPT 1 | Cr | 750 | 950 | 850 | 200 | 240 | 220 |
| Substrate | SUS304/HSS | 450 | 1056 | 929 | 229 | 274 | 253 |

*bias refers to FCVA bias, material refers to sputtered layers

Coating B

| Layer | Bias/ material* | Hardness Range Low | Hardness Range High | Typical value | Young's modulus Range Low | Young's modulus Range High | Typical value |
|---|---|---|---|---|---|---|---|
| ta-C 3 | 400 V/30% | 3800 | 4500 | 4300 | 367 | 471 | 400 |
| ta-C 2 | 400 V/10% | 2550 | 2950 | 2756 | 310 | 350 | 332 |
| ta-C 1 | 1000 V/20% | 1650 | 1927 | 1850 | 220 | 260 | 245 |
| SPT 3 | WC | 1340 | 1832 | 1627 | 237 | 280 | 245 |
| SPT 2 | CrW | 900 | 1280 | 1050 | 216 | 260 | 235 |
| SPT 1 | Cr | 750 | 950 | 850 | 200 | 240 | 220 |
| Substrate | SUS304/HSS | 450 | 1056 | 929 | 229 | 274 | 253 |

*bias refers to FCVA bias, material refers to sputtered layers

Example 1—Hardness

The hardness of the coatings of the invention and comparative coatings were determined using a nanoindenter (CSM NHT2) with a maximum load of 8 mN, a load/unload rate of 16 mN/min and a pause of 30 seconds. From the loading/unloading curve which shows force against indentation, the Vickers hardness value (HV) of each of the coatings was determined. These values are provided below:

| Coating | Hardness (HV) |
|---|---|
| Coating A | 3020 |
| Coating B | 4960 |
| Comparative Coating 1 | 1900 |
| Comparative Coating 2 | 1890 |
| Comparative Coating 3 | 1816 |
| Comparative Coating 4 | 1900 |

As can be seen, the coatings of the invention had superior hardness values compared to the comparative prior art coatings.

Example 2—Taber Abrasion Test

As an indication of the wear-resistance of the coatings, a Taber abrasion test was conducted on each of the coatings, with the following conditions:
Instrument: Taber Linear Abraser TLA 5700
Abradant: CS-17 Wearaser®
Test Load: 1.5 kg weight
Cycle Speed: 60 cycles/min
Stroke Length: 15 mm The number of cycles that each coating was subjected to and the status of the coating (acceptable or unacceptable) at the end of the indicated number of cycles is provided below.

| Coating | No. of Taber Abrasion Cycles | Coating Status |
|---|---|---|
| Coating A | 70,000 | Acceptable |
| Coating B | 70,000 | Acceptable |
| Comparative Coating 1 | 50,000 | Acceptable |
| Comparative Coating 2 | 11,000 | Unacceptable |
| Comparative Coating 3 | 17,000 | Unacceptable |
| Comparative Coating 4 | 70,000 | Acceptable |

The quality of comparative coatings 2 and 3 was unacceptable after less than 20,000 cycles. Whilst the coating status for comparative coating 1 was recorded as acceptable, this coating was only subjected to 50,000 cycles. By contrast, the coatings of the invention (A and B) and comparative coating 4 were all deemed acceptable, even after 70,000 cycles.

Example 3—Ball Crater Wear Test

As a further test of the wear-resistance of the coatings, each of the coatings were subjected to a wear test using a ball crater machine, as described below.
Instrument: Ball Crater Machine (CAT2)
Wear Time: 400 seconds
Ball Rotation Speed: 300 rpm
Ball diameter: 30 mm
Sample Slope Angle 25°
The results of testing were:

| Coating | Wear/Crater Outer Radius (μm) | Anti-Wear Performance |
|---|---|---|
| Coating A | 223 | Best |
| Coating B | 222 | Best |
| Comparative Coating 1 | 324 | Good |
| Comparative Coating 2 | 336 | Good |
| Comparative Coating 3 | 540 | Poor |
| Comparative Coating 4 | 580 | Poorest |

Example 4—Raman Spectroscopy

Raman Spectroscopy can be used to provide an indication of the ratio of $sp^2$ to $sp^3$ carbon atoms in amorphous carbon coatings. The measured Raman Spectroscopy curve can be compared with a simulated curve for a sample having 100% $sp^3$ carbon content. The $I_D/I_G$ ratio is therefore indicative of any differences between the observed spectrum and the expected spectrum for a coating with 100% $sp^3$ carbons—a higher $I_D/I_G$ ratio being indicative of a greater $sp^2$ carbon content.

| Coating | G Peak Position ($cm^{-1}$) | $I_D/I_G$ Ratio (Fit by BWF + Lorentzian) |
| --- | --- | --- |
| Coating A | 1527.7 | 0 |
| Coating B | 1575.9 | 0 |
| Comparative Coating 1 | 1548 | 0.16 |
| Comparative Coating 2 | 1546.2 | 0.12 |
| Comparative Coating 3 | 1561.2 | 0.34 |
| Comparative Coating 4 | 1564.4 | 0.55 |

The zero $I_D/I_G$ ratio for the coatings of the invention correlate to a match between the observed curve and the simulated curve for a coating having 100% $sp^3$ carbon content. Therefore, no $sp^3$ carbons were detected using this method in the coatings of the invention. By contrast, in the Comparative Coatings, higher $I_D/I_G$ ratios show the higher $sp^2$ content of the coatings, characteristic of DLC coatings.

Example 5—Scratch Test

A scratch test was performed on each of the coatings to determine their resistance to scratches applied along the coating surface under force. The scratch test was conducted using a moving diamond indenter/stylus with the following parameters:

Stylus material: Diamond
Spherical stylus tip radius: 200 μm
Stylus shape: Rockwell C geometry with an angle of 120°
Maximum load: 60N
Load speed: 40N/min The critical loads (i.e. the load at which severe coating deformations were first observed) for each coating are provided in the table below:

| Coating | Coating Thickness (μm) | Critical Load (N) |
| --- | --- | --- |
| Coating A | 2.5 | 37 |
| Coating B | 1.2 | 15 |
| Comparative Coating 1 | 2.7 | 10 |
| Comparative Coating 3 | 3.67 | 18 |
| Comparative Coating 4 | 3.5 | 27 |

As can be seen from the table, the greatest critical load was observed for Coating A. Whilst the critical load for Coating B was comparable to comparative coatings 2 and 3, it is noted that the thickness of Coating B is much less than for the comparative coatings.

Hence, on the basis of these findings, it is expected that the coatings of the invention are improved resistance to scratches compared to conventional coatings of a similar thickness.

Example 6—Tribo Test

In order to determine the wear resistance of the coatings under repeated, high force oscillating movements, a Tribo test was conducted using the Bruker TriboLab System. The Tribo test is a reciprocal "pin-on-disk" sliding test and mimics oscillating wear that may occur within an automobile engine. The Tribo test was carried out using the following parameters:

Reciprocal Sliding Frequency: 2 Hz
Loading force: 500-1600N
Pin (fixed ball) size: ¼ inch (6.35 mm) diameter The maximum loads that each of the coatings were subjected to and the resultant wear track dimensions (width and depth) are provided below.

| | | Wear Track | | |
| --- | --- | --- | --- | --- |
| Coating | Maximum Load (N) | Width (mm) | Depth (mm) | Performance |
| Coating A | 1600 | 0.77 | 2.35 | Lowest track depth wear under high load |
| Coating B | 1600 | 0.93 | 8.53 | Low track depth under high load |
| Comparative Coating 1 | 1500 | 1.28 | 10.36 | High track depth under high load |
| Comparative Coating 3 | 800 | 0.75 | 3.75 | Low track depth under low load |
| Comparative Coating 4 | 1400 | 0.9 | 9.56 | High track depth under high load |

Coating A had the lowest wear track (in terms of both width and depth) at the highest load (1600N). Whilst the wear track for Coating B was less than for Coating A, good wear resistance is still exhibited at a load of 1600N. Comparative coatings had significant wear tracks at maximum loads of less than 1600N.

Example 7—Wear and Scuff Test

The resistance of the coatings were tested against small lengths of pipe in place of drill bits, using a mini bench drill.

For the wear test, the pipe was an SUS304 stainless steel pipe with an outer diameter of 6 mm and an inner diameter of 4.5 mm. Any delamination of the coating was recorded.

For the scuff test, the pipe was an aluminium pipe with an outer diameter of 5 mm and an inner diameter of 4 mm. Any delamination of the coating or insertion of the aluminium into the coating was recorded.

The drill was set to rotate the pipe at a speed of 2500 rpm. The loads and drilling times were varied and oil was added evening 5 minutes during testing.

The observations are detailed in the table below.

| | Wear Test (with Stainless Steel pipe) | Scuff Test (with Aluminium pipe) |
| --- | --- | --- |
| Coating A | Some wear trace but no delamination following testing for 15 min with 35 kg load | Some wear trace but no delamination following testing for 5 min with 30 kg load. No delamination but some insertion after testing for 5 minutes with 35 kg load. |

| | Wear Test (with Stainless Steel pipe) | Scuff Test (with Aluminium pipe) |
|---|---|---|
| Coating B | Some wear trace but no delamination following testing for 15 min with 35 kg load | Some wear trace but no delamination following testing for 5 min with 30 kg load No delamination but some insertion after testing for 5 minutes with 35 kg load. |
| Comparative Coating 3 | Some wear trace but no delamination following testing for 15 min with 30 kg load, but some delamination following testing for 15 min with 35 kg. | Some wear trace but no delamination following testing for 5 min with 10 kg load No delamination but some insertion after testing for 5 minutes with 12 kg load. |

As can be seen in the Example above, coatings of the invention can have increased hardness, critical load, wear resistance and scuff resistance compared to the comparative coatings.

Example 8

A further coating of the invention was prepared as described below:

| Coating C | |
|---|---|
| Layer | Thickness |
| ta-C | 0.83 μm |
| ta-C | 0.2 μm |
| WC | 0.25 μm |
| CrWC | 0.95 μm |
| Cr | 0.8 μm |
| Substrate - Tool Steel | |
| Total Thickness (determined by CAR2) | ~3.0 μm |

| Layer | Hardness/HV Typical value |
|---|---|
| ta-C | 4500 |
| ta-C | 2500 |
| WC | 1586 |
| CrWC | 1090 |
| Cr | 850 |

Coating C was tested and found to show high hardness and passed our internal sandpaper test, with no delamination, both before and after exposure to 500° C. for 2 hours.

Example 9

A further coating of the invention was prepared as described below:

| Coating D | |
|---|---|
| Layer | Thickness |
| ta-C | 0.5 μm |
| ta-C | 0.3 μm |
| ta-C | 0.2 μm |
| SiC | 0.5 μm |
| Substrate - Ceramic | |
| Total Thickness (determined by CAR2) | ~1.5 μm |

| Layer | Hardness/HV Typical value |
|---|---|
| ta-C | 3500 |
| ta-C | 3000 |
| ta-C | 2800 |
| SiC | 665 |

Coating D was tested and passed our internal hatch test both before and after exposure to 500° C. for 2 hours. Coating D was also subjected to a Taber test with a Taber Abraser set to 1 kg, 60 rpm and 17 mm. The coating passed this test with no scratches both before and after exposure to 500° C. for 2 hours.

The invention thus provides hard coatings on substrates and methods for preparing the same.

The invention claimed is:

1. A substrate coated with a multi-layer coating, comprising in order from the outside towards the substrate:
a first functional ta-C-containing layer of hardness 2000 HV or greater,
a second functional ta-C-containing layer of hardness 1200 HV or greater,
a first intermediate layer comprising tungsten carbide,
a second intermediate layer comprising chromium tungstide, and
a further intermediate layer comprising chromium and adjacent the substrate,
wherein the ta-C has a hydrogen content less than 10% and an $sp^2$ content less than 30%;
wherein the first functional layer has a hardness at least 200 HV greater than the second functional layer; and
wherein (1) the Young's modulus or (2) the hardness or (3) both the Young's modulus and the hardness independently stay the same or increase from layer to layer from the second intermediate layer to the first functional layer.

2. A coated substrate according to claim 1, wherein the coating comprises one or more further functional layers comprising ta-C between the second functional layer and the first intermediate layer.

3. A coated substrate according to claim 1, wherein the ta-C has a hydrogen content of 5% or less and an $sp^2$ content of 20% or less.

4. A coated substrate according to claim 1, wherein the substrate is steel or a variety of steel.

5. A coated substrate according to claim 1, wherein the Young's modulus increases over a set of three adjacent layers in the coating.

6. A coated substrate according to claim 5, wherein the average increase in the Young's modulus is 10 GPa per layer, or more.

7. A coated substrate according to claim 1, wherein the coating has a hardness of at least 2000 HV.

8. A coated substrate according to claim 1, wherein the coating has a hardness of at least 4000 HV.

9. A coated substrate according to claim 1, wherein the hardness increases over any set of three adjacent layers in the coating.

10. A coated substrate according to claim 9, wherein the average increase in hardness is at least 300 HV per layer.

11. A coated substrate according to claim 10, wherein the average increase in hardness is at least 400 HV per layer.

12. A coated substrate according to claim 1, wherein the hardness of the functional layer adjacent the first intermediate layer is 1600 HV or more.

13. A coated substrate according to claim 1, wherein the coating has a total thickness of 5 microns or less.

14. A coated substrate according to claim 1, wherein the coating has a total thickness of 2 microns or less.

15. A coated substrate according to claim 1, wherein each layer of the coating has a thickness of 1 micron or less.

16. A coated substrate according to claim 1, wherein the substrate is selected from tools, cutting tools, tooling, industrial machines and components therefor.

17. A coated substrate according to claim 1, wherein the substrate is an engine component.

18. A method of making a coated substrate according to claim 1, comprising providing the substrate, and coating onto the substrate, in order:

a further intermediate layer comprising chromium,
a second intermediate layer comprising chromium tungstide,
a first intermediate layer comprising tungsten carbide,
a second functional ta-C containing layer of hardness 1200 HV or greater,
a first functional ta-C containing layer of hardness 2000 HV or greater,
wherein the ta-C has a hydrogen content less than 10% and an $sp^2$ content less than 30%;
wherein the first functional layer has a hardness at least 200 HV greater than the second functional layer;
wherein (1) the Young's modulus or (2) the hardness or (3) both the Young's modulus and the hardness independently stay the same or increase from layer to layer from the second intermediate layer to the first functional layer.

19. A method according to claim 18, wherein the functional layers are deposited by PVD.

20. A method according to claim 19, wherein the functional layers are deposited by FCVA.

* * * * *